United States Patent [19]

Todokoro et al.

[11] 4,295,072

[45] Oct. 13, 1981

[54] FIELD EMISSION ELECTRON GUN WITH ANODE HEATER AND PLURAL EXHAUSTS

[75] Inventors: Hideo Todokoro, Hinodemachi; Yoshio Sakitani, Ohimachi, both of Japan

[73] Assignee: Hitachi, Ltd., Tokyo, Japan

[21] Appl. No.: 8,259

[22] Filed: Feb. 1, 1979

[30] Foreign Application Priority Data

Feb. 8, 1978 [JP] Japan ............................ 53-13722[U]

[51] Int. Cl.³ ............................................. H01J 7/16
[52] U.S. Cl. ..................................... 313/7; 313/180; 250/457
[58] Field of Search .................... 313/7, 180, 38, 452; 250/457

[56] References Cited
U.S. PATENT DOCUMENTS

| | | | |
|---|---|---|---|
| 2,424,791 | 7/1947 | Bachman et al. | 313/7 X |
| 3,728,570 | 4/1973 | Smith et al. | 313/7 X |
| 4,019,077 | 4/1977 | Sakitani | 313/180 X |
| 4,140,905 | 2/1979 | Polanyi | 250/281 |

*Primary Examiner*—Robert Segal
*Attorney, Agent, or Firm*—Craig and Antonelli

[57] ABSTRACT

In a field emission electron gun including heating means for heating an anode to prevent gas emission from the anode due to bombardment thereof by the electron beam emitted from the cathode, the present invention provides a field emission electron gun including first exhaust means for defining a first chamber including the cathode and for exhausting said chamber to vacuum, and second exhaust means separate from said first exhaust means defining a chamber including said anode heating means for exhausting said chamber to vacuum independently of the first exhaust means. This construction makes it possible to maintain the chamber including the cathode constantly in the high vacuum state.

7 Claims, 2 Drawing Figures

FIELD EMISSION ELECTRON GUN WITH ANODE HEATER AND PLURAL EXHAUSTS

BACKGROUND OF THE INVENTION

This invention relates to an improvement in a field emission electron gun to be used for a scanning type electron microscope and the like.

The field emission electron gun has the excellent feature that in comparison with a thermal electron gun, it has a brightness $10^3$ times as high as that of the latter. To put the field emission electron gun to practical use, however, it is necessary to place the gun under a high vacuum of below $10^{-9}$ Torr. To maintain this high vacuum during emission of electrons, furthermore, it is an essential requirement to prevent gases emitted from the anode due to electron bombardment from contaminating the atmosphere of the electron gun in the vicinity of the cathode.

As a method of preventing such gas emission, there has conventionally been known a heating degassing method in which the anode is heated by heating means, such as a heater, so as to perform degassing. According to this method, however, large quantities of gases are emitted from the heating means itself during the treatment of the anode, thereby lowering the vacuum and thus failing to maintain the high vacuum state.

SUMMARY OF THE INVENTION

The present invention provides a solution to the above-mentioned problem and is directed to provision of a field emission electron gun which is capable of maintaining constantly the high vacuum state in the vicinity of the cathode.

To accomplish the above-mentioned object, the apparatus of the present invention includes a field emission cathode, an anode, heating means for heating the anode and thereby preventing the gas emission from the anode caused by bombardment of electrons emitted from the cathode, a first exhaust means defining a chamber including the cathode for exhausting the chamber to vacuum and a second exhaust means disposed adjacent the first exhaust means via the anode, defining a chamber including the anode heating means for exhausting the chamber to vacuum independently of the first exhaust means.

DETAILED DESCRIPTION OF THE PREFERRED EMBODIMENTS

Figure 1:
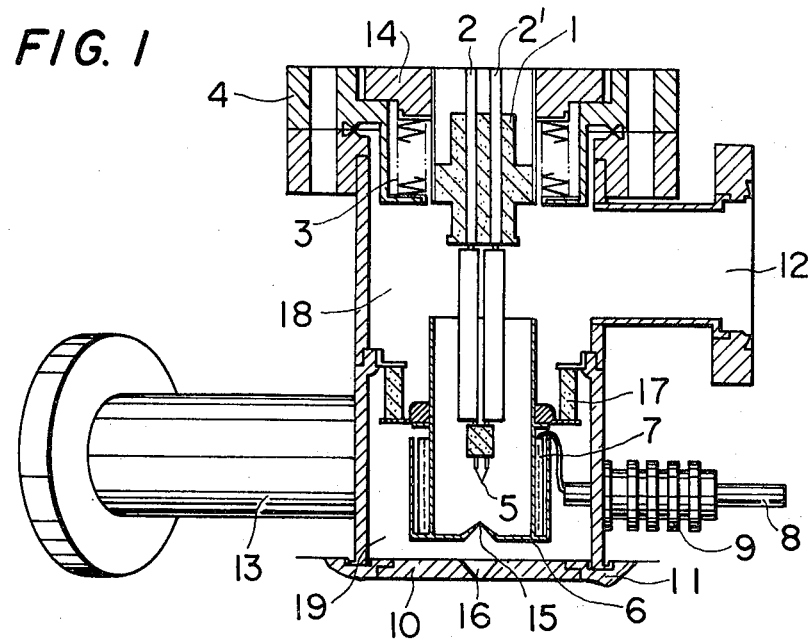
FIG. 1 is a schematic view showing an embodiment of the field emission electron gun in accordance with the present invention.

FIG. 1 shows an exemplary embodiment of an electron gun in accordance with the present invention in which a field emission cathode 5 (or FE-tip) is secured to lead terminals 2,2' passing through a vacuum-resistant insulator 1, which is connected to a sliding flange 14 and also to a flange 4 via a bellows 3. The sliding flange 14 is allowed to move horizontally by means of an adjust screw (not shown) so as to make it possible to center the field emission cathode with respect to an aperture 15 of a first anode 6.

In this embodiment, the first anode 6 has a cup-like shape with the aperture 15 through which an electron beam is allowed to pass being located at its bottom. The aperture 15 may have a diameter ranging from about 0.2 to about 1 mm$\phi$ and has generally a diameter of about 0.5 mm$\phi$. The first anode 6 is secured to one side of a ring-like insulator 17, the other side of which is secured to the wall 20 of the electron gun in any conventional manner. Heating means 7, such as a heater, is externally wound around the first anode 6 so that the anode is heated when current is fed from a pin 8 of a lead insulator 9 to the heating means 7. The first anode 6 is secured to the ring-like insulator 17 so as to be thermally insulated. It is therefore possible to easily heat the first anode 6 to a high temperature. For the degassing treatment, a temperature of about 300°–500° C. is necessary.

A second anode 10 having an aperture 16 in alignment with the aperture 15 is disposed below the first anode 6. The electron beam passing through the apertures 15 and 16 from the cathode 5 is either condensed or magnified by an electron lens which is formed at the lower portion of the flange 11.

The electron gun is divided into two chambers, i.e., an upper chamber 18 and a lower chamber 19, that are exhausted, respectively, by exhaust ports 12 and 13. Vacuum communication between the chambers 18 and 19 is established only through the aperture 15 through which the electron beam passes. Therefore, it is possible to maintain a vacuum difference between the upper chamber 18 and the lower chamber 19 in order of two digits at this aperture 15. The table below illustrates an example of the relationship of vacuum between the upper chamber and the lower chamber, using the diameter d of the aperture as a parameter.

| Vacuum of Upper Chamber | | | Vacuum of |
| d = 1mm | d = 0.5mm | d = 0.2mm | Lower Chamber |
| --- | --- | --- | --- |
| Torr | Torr | Torr | Torr |
| $9 \times 10^{-8}$ | $2.3 \times 10^{-8}$ | $3.6 \times 10^{-9}$ | $1 \times 10^{-6}$ |
| $9 \times 10^{-9}$ | $2.3 \times 10^{-9}$ | $3.6 \times 10^{-10}$ | $1 \times 10^{-7}$ |
| $9 \times 10^{-10}$ | $2.3 \times 10^{-10}$ | $3.6 \times 10^{-11}$ | $1 \times 10^{-8}$ |

As can be seen from this example, when d=0.5 mm and the vacuum in the upper chamber is $2.3 \times 10^{-8}$ Torr, whereby it is possible to maintain a vacuum difference between the two chambers in order of two digits. Incidentally, this example represents a case where both the upper chamber 18 and the lower chamber 19 are exhausted respectively by the use of two vacuum pumps (e.g., ion pumps, etc.) each having substantially an equal capacity to the other. If a vacuum pump having a greater capacity is used for exhausting the upper chamber, the vacuum difference between the two chambers can be further enhanced.

Figure 2:
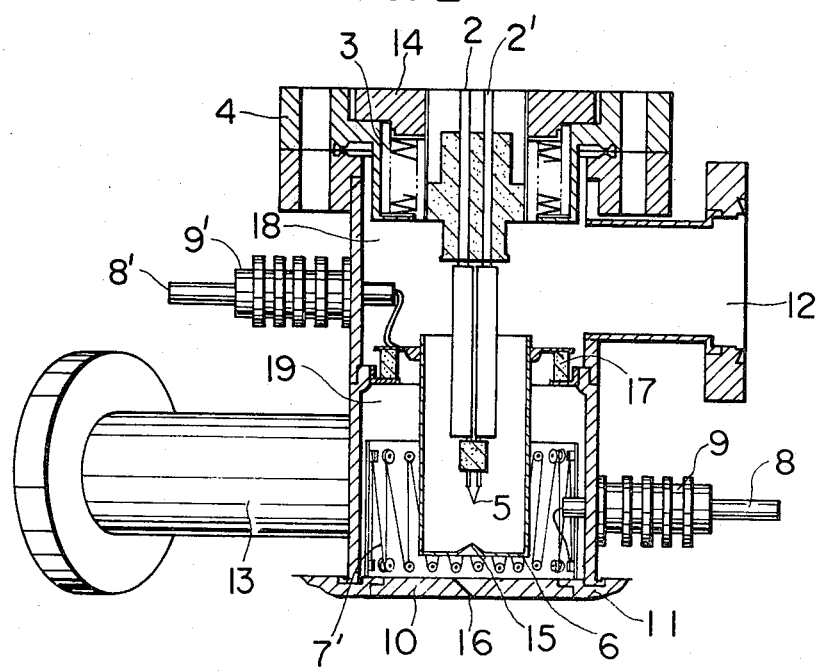
FIG. 2 is a schematic view showing another embodiment of the present invention.

FIG. 2 shows another embodiment of the present invention wherein reference numerals 1 through 19 are used to identify like constituent elements as appear in the embodiment of FIG. 1. In this embodiment the heating means 7', such as a heater, is disposed outside the first anode 6 so as to heat the anode 6 by radiant heat. In this case also, the objects of the present invention can be achieved in a manner similar to that previously described. Namely, a vacuum difference can be maintained between the upper chamber 18 and the lower chamber 19 in the same way as in the first embodiment. In FIG. 2 the first anode 6 is supplied with a voltage via the pin 8' of the lead terminal 9' and the heating means 7' is fed with a current and heated from the pin 8 of the lead terminal 9.

As explained above, the present invention has the construction wherein the first anode 6 is used as the vacuum separation wall. Accordingly, it is possible to prevent lowering of the vacuum in the chamber housing the cathode 5 due to gases emitted in large quantities from the heating means associated with the first anode during treatment of the anode. Even when the vacuum becomes $10^{-6}$ Torr in the lower chamber, for example, it is possible to maintain the vacuum of $10^{-8}$ Torr in the upper chamber. The lead terminal 9 is prepared to withstand high voltage and the electron gun of the present invention is used as an ordinary butler type electron gun after heat treatment of the first anode 6.

It is to be noted that the present invention is not necessarily limited to the use of a first anode of particular shape, to heating means of particular form and the like or to the definite numeric values used for the explanation of the above-mentioned embodiments, and that these features can be suitably selected or adapted in accordance with set conditions.

While we have shown and described an embodiment of the present invention, it is to be understood that the same is not limited thereto but is susceptible of numerous changes and modifications as known to those of ordinary skill in the art, and we therefore do not wish to be limited to the details shown and described herein but intend to cover all such changes and modifications as are obvious to those skilled in the art.

What is claimed is:

1. A field emission electron gun comprising:
   a field emission cathode;
   an anode having an aperture through which an electron beam emitted by said cathode can pass;
   heating means for heating said anode;
   a first chamber in which said cathode is disposed;
   first exhaust means for evacuating said first chamber;
   a second chamber adjoining said first chamber through said anode and in which said heating means is disposed, and
   second exhaust means for evacuating said second chamber independently from said first chamber.

2. The field emission electron gun as defined in claim 1 wherein said anode has a cup-like shape having at its bottom said aperture allowing passage therethrough of the electron beam emitted from said cathode.

3. The field emission electron gun as defined in claim 1 wherein said heating means is disposed around the outer circumference of said anode.

4. The field emission electron gun as defined in claim 1 wherein said heating means consists of a heater in contact with said anode.

5. The field emission electron gun as defined in claim 1 wherein said heating means consists of a heater spaced from said anode.

6. The field emission electron gun as defined in claims 1 or 2 wherein the diameter of said aperture formed in said anode is in the range of from 0.2 mm to 1.0 mm.

7. The field emission electron gun as defined in claims 1 or 2 wherein the diameter of said aperture formed in said anode is 0.5 mm.

* * * * *